United States Patent
Burggraf et al.

(10) Patent No.: US 9,362,154 B2
(45) Date of Patent: Jun. 7, 2016

(54) METHOD FOR TREATMENT OF A TEMPORARILY BONDED PRODUCT WAFER

(75) Inventors: Jürgen Burggraf, Schärding (AT); Harald Wiesbauer, Altheim (AT); Markus Wimplinger, Ried am Innkreis (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 240 days.

(21) Appl. No.: 13/575,316

(22) PCT Filed: Nov. 23, 2010

(86) PCT No.: PCT/EP2010/007098
§ 371 (c)(1), (2), (4) Date: Jul. 26, 2012

(87) PCT Pub. No.: WO2011/095189
PCT Pub. Date: Aug. 11, 2011

(65) Prior Publication Data
US 2012/0292288 A1 Nov. 22, 2012

(30) Foreign Application Priority Data
Feb. 5, 2010 (DE) .......................... 10 2010 007 127

(51) Int. Cl.
*H01L 21/304* (2006.01)
*H01L 21/683* (2006.01)

(52) U.S. Cl.
CPC ........ *H01L 21/6835* (2013.01); *H01L 21/6836* (2013.01); *H01L 2221/6834* (2013.01); *H01L 2221/68327* (2013.01)

(58) Field of Classification Search
CPC ............ H01L 21/6835; H01L 21/6836; H01L 21/02013; H01L 21/02016; H01L 21/304; H01L 21/463
USPC ........... 216/36, 52, 53, 99; 438/690, 964, 750
See application file for complete search history.

(56) References Cited

U.S. PATENT DOCUMENTS

| 2006/0008650 A1* | 1/2006 | Wesselmann | ........... B24B 37/34 428/411.1 |
| 2006/0284285 A1* | 12/2006 | Fukazawa | ..................... 257/618 |

(Continued)

FOREIGN PATENT DOCUMENTS

| JP | H 1064920 A | 3/1998 | ............ C02F 1/1333 |
| JP | 2004-079889 A | 3/2004 | ................ B24B 1/00 |

(Continued)

OTHER PUBLICATIONS

International Search Report for International Application No. PCT/EP2010/007098, Jun. 7, 2011.

(Continued)

*Primary Examiner* — Binh X Tran
(74) *Attorney, Agent, or Firm* — Kusner & Jaffe

(57) ABSTRACT

A method for treatment of a product wafer temporarily bonded on a carrier wafer with the following steps: grinding and/or backthinning of the product wafer on one flat side facing away from the carrier wafer to a product wafer thickness D of <150 μm, especially <100 μm, preferably <75 μm, even more preferably <50 μm, especially preferably <30 μm, surface treatment of the flat side with means for reducing an especially structural intrinsic stress of the product wafer.

15 Claims, 1 Drawing Sheet

(56) References Cited

U.S. PATENT DOCUMENTS

| | | | | |
|---|---|---|---|---|
| 2007/0077685 | A1 | 4/2007 | Noda et al. | 438/107 |
| 2007/0284038 | A1* | 12/2007 | Yamamoto et al. | 156/297 |
| 2008/0318362 | A1* | 12/2008 | Miyazaki et al. | 438/113 |
| 2009/0199957 | A1 | 8/2009 | Inao | 156/154 |
| 2010/0006893 | A1* | 1/2010 | Cody | H01L 21/02381 257/190 |
| 2011/0101373 | A1* | 5/2011 | Arena et al. | 257/76 |
| 2013/0113359 | A1* | 5/2013 | Swager et al. | 313/232 |

FOREIGN PATENT DOCUMENTS

| | | | | |
|---|---|---|---|---|
| JP | 2004-186522 | | 7/2004 | H01L 21/304 |
| JP | 2004-530302 | A | 9/2004 | B24B 41/06 |
| JP | 2005-136167 | A | 5/2005 | C30B 29/40 |
| JP | 2007-512706 | A | 5/2007 | B24B 37/04 |
| JP | 2007-242655 | A | 9/2007 | H01L 21/304 |
| JP | 2008-140856 | A | 6/2008 | C23C 16/24 |
| JP | 2009-302163 | A | 12/2009 | H01L 212/02 |
| WO | WO 03083002 | A1 | 10/2003 | C09J 7/02 |
| WO | WO 2006008824 | A1* | 1/2006 | |
| WO | WO 2006-090650 | A1 | 8/2006 | H01L 21/301 |

OTHER PUBLICATIONS

Office Action received in corresponding Japanese Patent Application No. 2012-551501, dated Jul. 22, 2014.

Article entitled "Thermal expansion," from website https://en.wikipedia.org/w/index.php?title=Thermal_expansion&oldid=673434321 last visited Jul. 28, 2015, Wikepedia®.

* cited by examiner

METHOD FOR TREATMENT OF A TEMPORARILY BONDED PRODUCT WAFER

FIELD of INVENTION

The invention relates to a method and a device for treatment of a temporarily bonded wafer.

BACKGROUND of INVENTION

Novel, three-dimensional integrated circuits require reliable methods for handling of thin wafers in order to be able to successfully transport the thin wafers through the necessary product processes on the wafer back. The method of temporary bonding had become established in past years. In it the product wafer with a fully or partially finished first main surface is mounted on a carrier by means of a suitable method, especially by means of adhesive technology. Here this first main surface points in the direction of the carrier wafer. The product wafer is then thinned by means of known grinding techniques. After this thinning process other production steps are carried out on the back of the thin wafer. In the past, processes in which high thermal stresses were produced in the wafer, such as for example abrupt heating and/or cooling, led to problems. Often the wafer acquired dimples which made further processing impossible. The dimples are at the same time sites on which the adhesive used for fixing of thin wafers runs and thus the adhesive thickness is not uniform.

Wafer thinning on backgrind tapes (BG tape), therefore not stable carrier substrates, is known. Here the wafer is usually only thinned by means of grinding methods. There is no further working on the wafer back. At least in this case complex structures such as wiring lines or the like are no longer produced. In this region it is conventional to thin the wafers by means of a succession of coarse and fine grinding processes. These grinding processes however generally leave damage to the crystal structure on the ground wafer surface. This damage leads to stresses. Therefore, in this domain possibilities for eliminating this damaged layer have been researched in recent years. The result is so-called "stress relief processes". But in order to be able to bypass these processes, manufacturers of grinding systems and grinding tools such as for example the Disco company in Japan have also worked on grinding wheels which eliminate the necessity of stress relief. One very popular product in this domain is for example the so-called Polygrind grinding wheel which makes it possible to saw the wafers immediately after thinning and to deliver them into the final chip packaging (called "packaging" in the industry).

The second relevant domain is the domain of thinning of wafers which are mounted on rigid carrier substrates. In this domain the wafers are likewise thinned to the desired target thickness by means of coarse and fine grinding methods. Typically target thicknesses of less than 100 µm are desirable. But recently wafers are being thinned preferably to 75 or 50 µm. It is expected in the future that the wafers will be more radically thinned to 30, 20 or even 10 µm. In this range the detailed process sequence in thinning of the wafer has been conventionally determined by the necessary surface quality. Often the backthinning process ends with the use of fine grinding processes employing the Polygrind grinding wheels. In this domain to date intentionally chosen processes have not been used to improve the surface quality for further working, especially in thermal applications. This is among others also the case because the rigid carrier was regarded as a sufficient means to adequately support and keep flat the thin wafer during the following process.

Therefore the object of this invention is to devise a device and a method with which further handling is facilitated or enabled with increasingly thinner, temporarily fixed product wafers, especially for following chemical processes.

This object is achieved with the features of the claims. Advantageous developments of the invention are given in the dependent claims. All combinations of at least the two features given in the specification, the claims and/or the figures also fall within the framework of the invention. At the given value ranges, values within the indicated limits will also be disclosed as boundary values and will be claimed in any combination.

SUMMARY of INVENTION

The invention relates to a method for avoiding the aforementioned dimples in thinning of wafers and thus ensuring the quality of the temporarily bonded wafers during the process flow. If the surface defects were not avoided, problems would arise in the further processing.

The phenomenon of dimples has become a serious problem only in the recent past. The main reason for this should be the circumstance that only now are very small target thicknesses (see above) desirable for thin wafers. If the wafers become thinner, the intrinsic stiffness of the thin wafers decreases, as a result of which the stress (intrinsic stress) which arises due to crystal defects according to the findings of the applicant continues to be counteracted only with a less stable wafer. Rather wafers in this thickness range are very pliable and flexible.

It is pointed out that only recently has this type of carrier technology for processing of ultrathin wafers been used to produce mainly stacked dies or so-called "3D packages".

Especially unfavorable conditions in conjunction with dimple formation arise when, as the thickness of the wafers decreases, they also have increasing topography on the front and are to be embedded in the adhesive located between the carrier and product wafer. This topography for wafers with little topography is less than 10 µm, typically less than 20 µm; this results in adhesive thicknesses from 10 to 30 µm in this case. Here it should be noted that conventionally the adhesive thickness is chosen to be roughly 10 µm thicker than the height of the topography. For wafers with high topography, topography heights of >30 µm, often with >50 µm, but typically with >70 µm and in many cases with >100 µm can be expected.

The higher adhesive thickness in conjunction with the very thin wafers results in that even slight stress in the wafer is sufficient to cause dimples. This is a phenomenon which occurs mainly for thermoplastic adhesives which lose viscosity at elevated temperature. This represents requirements which cannot be found in the case of conventional (prior art) backgrinding on BG tape. The higher adhesive thickness enables easier flow of the adhesive; this, associated with the very low intrinsic stiffness of the product wafer, promotes dimple formation.

The advantage of the new invention consist in that surface defects in backthinning of temporarily bonded wafers can be completely avoided; this is a significant improvement in the quality of the final product. Furthermore this is associated with a performance improvement of the production process since the dimples no longer occur even at higher temperatures to which the wafers are generally still subject in the production process.

Since dimple formation is also dependent on temperature (since with rising temperature the viscosity of thermoplastic adhesives decreases), the temperature range in which the wafers can be processed can be widened by this invention. Mainly in PECVD processes in which higher temperatures are used and in which by the action of plasma additional thermal energy is delivered into the wafer, dimple formation must be completely stopped. It has already been demonstrated that this invention in fact stops dimple formation. Ultrathin wafers with this type of stacked structures are generally processed above 50° C., especially above 75° C. and in particular above 100° C., with which the indicated invention becomes indispensable to avoid dimple formation.

Therefore the invention is based on the idea of setting the stress of the thin wafer after grinding in a dedicated manner. Here the thin wafer is mounted on a carrier by means of known methods. This carrier wafer can fundamentally consist of any material with the corresponding mechanical properties, But preferably silicon, glass and certain ceramic materials are used. One main feature here is based on the carrier having a thermal coefficient of expansion which is matched/as identical as possible to that of the product wafer (for example, silicon) both in spots and also with respect to the characteristic of the coefficient over the temperature range. Here it should be mentioned as a preferred version that the product wafer with the already processed side is adhesiveed onto the carrier wafer using a thermoplastic or at least largely thermoplastic adhesive. One example of this adhesive is the HT 10,10 Material from Brewer Science Inc., Rolla, Mo., USA. Then the wafer is thinned by means of grinding methods. This thinning process takes place from the interplay of coarse and fine grinding processes. The decisive part of the invention is to subject the wafer to a further suitable process which makes it possible to remove the layer with the damaged crystal structure either entirely or partially in a controlled manner. Furthermore it is pointed out that the crystal structure can be defective not only on the surface, but also to a few gm underneath the surface, therefore the defects are present over a great depth, especially deeper than 0.5 µm, 1 µm, 3 µm, 5 µm and even 10 µm.

It is therefore not enough to remove only a few layers of atoms to remove the defects near the surface.

In partial removal it is possible to set the stress of the wafer in a dedicated manner and thus to compensate for possible intrinsic stresses of the wafer which could be present for example as a result of the layer on the active side. Thus the wafer no longer arches during subsequent processes with a high thermal stress.

Suitable processes for removal of this damaged layer are:
polishing processes—for example the "dry polish process" from Disco,
wet etching processes which are carried out by means of suitable chemicals,
drying processes,
a combination of the aforementioned processes.

The invention consists in a process flow, characterized in that
a carrier wafer is temporarily bonded to a structure wafer via an adhesion material
aftertreatment of the structure wafer takes place after back-thinning
aftertreatment of the structure wafer is a combination of cleaning and chemical mechanical polishing (CMP), characterized in that in CMP the surface roughness produced by brittle fracture, the cracks and the built-in intrinsic stresses are reduced or completely eliminated
due to the resulting smoother surface fewer structure defects are present which are used at higher temperatures finally as a starting point for the aforementioned surface defects (dimples)
due to CMP the intrinsic stresses in the structure wafer are dramatically smaller than in the structure wafers which have been thinned by grinding
due to the lower intrinsic stresses a local elastic kinking and/or plastic deformation of the very thin structure wafer into the underlying adhesion layer, mainly at higher temperatures, is prevented
without these surface defects (dimples) the quality of the structure wafer is extremely enhanced
the controlling factor 0.5 µm, 1 µm, 5 µm, and 10 µm.

The invention consists in a process flow, characterized in that
a carrier wafer is temporarily bonded to a structure wafer via an adhesion material
aftertreatment of the structure wafer takes place after back-thinning
aftertreatment of the structure wafer is a combination of cleaning and chemical mechanical polishing (CMP), characterized in that in CMP the surface roughness produced by brittle fracture, the cracks and the built-in intrinsic stresses are reduced or completely eliminated
due to the resulting smoother surface fewer structure defects are present which are used at higher temperatures finally as a starting point for the aforementioned surface defects (dimples)
due to CMP the intrinsic stresses in the structure wafer are dramatically smaller than in the structure wafers which have been thinned by grinding
due to the lower intrinsic stresses a local elastic kinking and/or plastic deformation of the very thin structure wafer into the underlying adhesion layer, mainly at higher temperatures, is prevented
without these surface defects (dimples) the quality of the structure wafer is extremely enhanced
the controlling factor 0.5 µm, 1 µm, 3 µm, 5 mµ, and 10 µm.

All combinations of at least the two features given in the specification, the claims and/or the figures also fall within the framework of the invention. At the given value ranges, values within the indicated limits will also be disclosed as boundary values and will be claimed in any combination.

Other advantages, features and details of the invention will become apparent from the following description of preferred exemplary embodiments and using the drawings.

DETAILED DESCRIPTION OF PREFERRED EMBODIMENT

Figure 1:
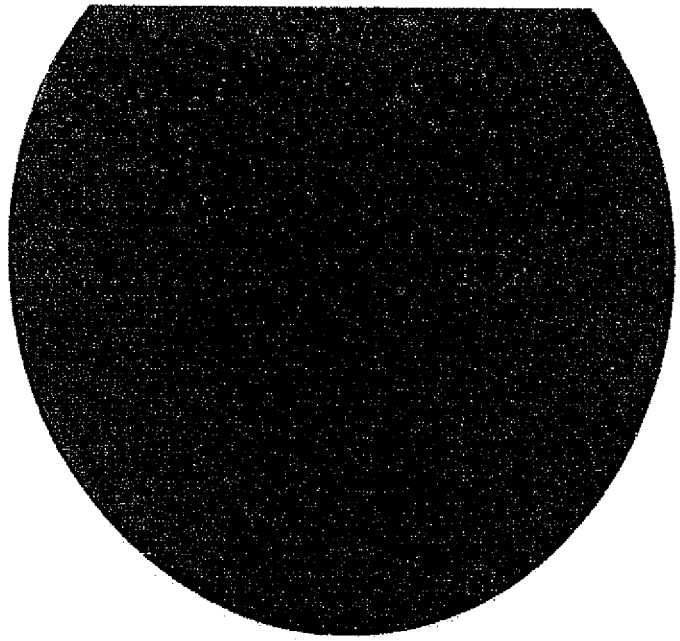
FIG. 1 shows a surface of a temporarily bonded product wafer after a grinding process according to the prior art (C-SAM photograph)
Figure 2:
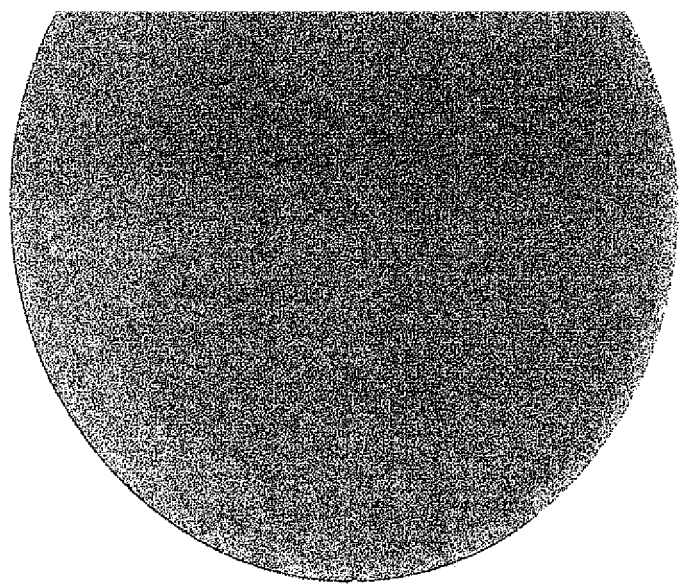
FIG. 2 shows a surface of a temporarily bonded product wafer after treatment according to this invention (C-SAM photograph).

The figures show that the product wafer as shown in FIG. 1 has distinct dimples, whereas the product wafer shown in FIG. 2 has practically no dimples.

Having described the invention, the following is claimed:
1. Method for treatment of a product wafer temporarily bonded on a rigid carrier wafer with the following steps:
providing a rigid carrier wafer having a surface and an adhesive disposed on said surface;
fixing a processed side of the product wafer to the adhesive disposed on the surface of the rigid carrier wafer, grinding and/or backthinning of the product wafer on one flat side facing away from the surface of the rigid carrier wafer to a product wafer thickness D of <150 µm, and surface treating the flat side with means for reducing a structural intrinsic stress of the product wafer, the means setting the intrinsic stress of the product wafer to cause the product wafer to arch toward the rigid carrier wafer during a following thermal process.

2. Method as claimed in claim 1, wherein the step of surface treatment takes place at a location that is separated in space from the location of the step of backthinning.

3. Method as claimed in claim 1, wherein the means for reducing the intrinsic stress are characterized by at least one of the following features:
   dry polishing of the flat side,
   wet etching of the flat side, and
   dry etching of the flat side.

4. Method as claimed in claim 1, wherein the rigid carrier wafer has a coefficient of expansion which is identical to the coefficient of expansion of the product wafer.

5. Method as claimed in claim 1, wherein the product wafer thickness D is less than 30 µm.

6. Method as claimed in claim 1, wherein after surface treatment a thermal process step follows at a temperature greater than 100° C.

7. Method as claimed in claim 1, wherein the rigid carrier wafer includes one or more of the following materials: silicon, glass or ceramic.

8. Method as claimed in claim 1, wherein the product wafer with its contact side which is opposite the flat side is temporarily connected to the rigid carrier wafer using a thermoplastic adhesive.

9. Method as claimed in claim 8, wherein the contact side of the product wafer has topographies which are embedded into the adhesive.

10. Method as claimed in claim 1, wherein after surface treatment a thermal process step follows at temperatures >50° C.

11. Method as claimed in claim 10, wherein the thermal process step is a chemical gas phase deposition process.

12. Method as claimed in claim 1, wherein the means for reducing the intrinsic stress includes removing at least partially a defined layer thickness S of a crystal structure of the flat side which has been damaged by grinding and/or backthinning.

13. Method as claimed in claim 12, wherein the layer thickness is S<10 µm.

14. Method as claimed in claim 12, wherein the layer thickness S is less than 1 µm.

15. Method as claimed in claim 12, wherein the layer thickness S is less than 0.5 µm.

\* \* \* \* \*